（12） United States Patent
Moussy et al.

(10) Patent No.: US 7,049,673 B2
(45) Date of Patent: May 23, 2006

(54) PHOTOELECTRIC DETECTION DEVICE AND METHOD FOR ITS PRODUCTION

(75) Inventors: Norbert Moussy, Sainte-Agnes (FR); Cyril Guedj, Varces Allieres et Risset (FR)

(73) Assignee: Commissariat A l'Energie Atomique, Paris (FR)

( * ) Notice: Subject to any disclaimer, the term of this patent is extended or adjusted under 35 U.S.C. 154(b) by 190 days.

(21) Appl. No.: 10/718,150

(22) Filed: Nov. 20, 2003

(65) Prior Publication Data

US 2004/0108517 A1    Jun. 10, 2004

(30) Foreign Application Priority Data

Nov. 29, 2002    (FR) .................................. 02 15023

(51) Int. Cl.
*H01L 31/117* (2006.01)

(52) U.S. Cl. ..................... 257/458; 257/444; 438/48

(58) Field of Classification Search ................ 257/184, 257/444, 458
See application file for complete search history.

(56) References Cited

U.S. PATENT DOCUMENTS

| 6,759,262 | B1* | 7/2004 | Theil et al. ............... 438/48 |
| 6,798,033 | B1* | 9/2004 | Chao et al. ............... 257/444 |
| 2002/0171083 | A1* | 11/2002 | Lim et al. ............... 257/59 |

FOREIGN PATENT DOCUMENTS

| EP | 0 517 208 A1 | 12/1992 |
| EP | 1 122 790 A2 | 8/2001 |
| WO | WO 02/50921 A1 | 6/2002 |

* cited by examiner

*Primary Examiner*—David Nelms
*Assistant Examiner*—Dao H. Nguyen
(74) *Attorney, Agent, or Firm*—Burr & Brown

(57) ABSTRACT

This photoelectric detection device comprises a matrix of elementary detectors on an insulating substrate. Each of the elementary detectors has a stack consisting of a lower electrode, a layer of a photosensitive material and a phototransparent upper electrode. The upper electrode is common to all the elementary detectors. Each of the lower electrodes is connected independently of one another to a sense circuit. The lower electrodes are each positioned on an individualized insulating zone, which is raised with respect to the insulating substrate. Furthermore, the upper electrode is not flat and is inserted between two adjacent zones until it reaches a level below that of the lower electrodes.

8 Claims, 1 Drawing Sheet

PHOTOELECTRIC DETECTION DEVICE AND METHOD FOR ITS PRODUCTION

This application claims the benefit of French Application 02.15023, filed Nov. 29,2002, the entirety of which is incorporated herein by reference.

FIELD OF THE INVENTION

The field of the invention is that of optical detectors conventionally comprising a detection layer associated with a sense circuit, in particular one produced according to the so-called "above IC" structure, i.e. above an integrated circuit, in the field of microelectronics.

BACKGROUND OF THE INVENTION

Optical detectors are conventionally intended to detect a light intensity and to convert it into an electrical signal, the amplitude of which is proportional to the detected light intensity. These electrical signals are generally processed, particularly in the sense circuit, in order to reproduce an image of the detected scene.

With a view to miniaturizing these detection devices, attempts have been made to integrate the actual detection with the signal processing circuit associated with it.

The principle of an "above IC" structure, moreover, has the advantage of making it possible to achieve a fill factor of close to 100% for the detection pixels, since the detection circuit lies underneath the detection layer.

The detection layer, which is interconnected with the sense circuit through an insulating substrate, traditionally consists of elementary detectors in the form of a matrix. Each of these elementary detectors has a so-called lower electrode which is produced on the said insulating substrate, typically silica or a silicon nitride, and which is connected to the sense circuit by means of an electrical conductor passing through the substrate, traditionally referred to as a "plug" or "via". This lower electrode is covered with a photosensitive layer, typically consisting of a P-I-N, N-I-P, P-I, N-I, I-P or I-N diode made of amorphous silicon, all of the matrix being covered with a phototransparent upper electrode which is therefore common to all the pixels of the matrix.

The diodes are reverse-biased with a voltage of a few volts between the upper electrode and the lower electrode.

When the intrinsic photosensitive layer absorbs a photon, it therefore emits an electron-hole pair which diffuses towards the metal electrodes, respectively lower and upper, along the field lines imposed by these electrodes, and the particles are collected and stored for a certain integration time, before finally being counted by the sense circuit.

If the photosensitive layer is made of amorphous silicon, the total thickness of the detection layers made of such a material depends partly on the wavelengths to be observed and detected, and typically has a thickness of the order 500 nanometres for correct detection of red light, and 50 nanometres to keep only the absorption of blue light.

The detection layer may be etched at the edge of the matrix, in order to make it possible to make the phototransparent upper layer descend and bias it by providing direct contact with a connector or "plug" of the sense circuit.

Each pixel of the lower electrode is connected individually to the sense circuit, so as to be able to address it, sense it and multiplex the information which is obtained, in order to be able to construct therefrom an image corresponding to the observed detection.

One of the problems often encountered with this type of structure involves the inter-pixel leakage currents at the lower electrodes, in particular due to the appearance of a potential difference between two neighbouring lower electrodes.

In order to overcome this difficulty, U.S. Pat. No. 6,215, 164 has proposed a particular structure of P-I-N or N-I-P diodes for photoelectric detectors. They adopt a particular profile, especially with the intrinsic detection layer, obtained by matrixing the doped lower layer so as to cover only the metal of the lower electrode. The photosensitive layer of each of the pixels is isolated from the photosensitive layer of the adjacent pixel by means of an oxide, typically a silicon oxide or $Si_3N_4$, or a combination of the two, the purpose of which is to limit the optical intermodulation, a term which is generally used to describe the aforementioned phenomenon of inter-pixel leakage currents.

Matrixing the sensitive layers, however, presents the drawback of demanding regrowth on each level which is intended to be matrixed. It is found that the problems inherent in contamination of the surface and of repeated contact have the effect of increasing the dark current of the detectors obtained in this way, and therefore their sensitivity in respect of weak illumination.

It has also been proposed, for example in document U.S. Pat. No. 6,114,739, to omit the lower doped layer by taking care to correctly select the quality of the metal-photosensitive layer contact of the Schottky contact type.

Another difficulty to be surmounted in the scope of producing such photoelectric detectors is that a high fill factor is intended to be provided in the detector itself. The inter-pixel spacing should consequently be as small as possible, typically of the order of 500 nanometres, whereas the size of the pixels may be as much as a few micrometres.

Reducing the inter-pixel space, however, increases the optical intermodulation phenomena which are precisely that which is intended to be eliminated, or at least limited.

In order to overcome these drawbacks, it has been proposed, for example in document EP-A-0 494 694, to provide the photosensitive layer with a rounded profile at each of the pixels. FIG. 1 accordingly represents a schematic view of the detector in question. It has an insulating substrate (1), in particular made of silicon oxide, and one lower electrode (2) per pixel, surmounted by a photosensitive layer (3) which is made of amorphous silicon and adopts a rounded profile. The assembly obtained in this way is covered with a phototransparent upper electrode (4), which follows the profile of the said photosensitive layer. This type of matrixing, however, also has the drawback of demanding layer regrowth with the same problems of surface contamination as those mentioned in document U.S. Pat. No. 6,215,164.

The technology which is used, namely mounting above an integrated circuit, moreover gives rise to problems in the bonding of the upper layer on the sense circuit. Especially when amorphous silicon detectors are used, the bonding of the thick strained layers with a high hydrogen density constitutes a notable difficulty.

The problem is even more exacerbated when the layer to be bonded is not doped, as is the case for I-P or I-N structures.

SUMMARY OF THE INVENTION

It is an object of the present invention to obviate these various drawbacks. It firstly relates to structuring of the surface of the sense circuit so as to promote optical isolation between pixels (optical intermodulation) while increasing the fill factor.

The invention therefore provides a photoelectric detection device comprising a matrix of elementary detectors on an insulating substrate, each of the said elementary detectors comprising a stack consisting of a lower electrode, a layer of a photosensitive material and a phototransparent upper electrode, the said upper electrode being common to all the elementary detectors, each of the lower electrodes being connected independently of one another to a sense circuit.

It is characterized:
in that the lower electrodes are each positioned on an individualized insulating zone which is elevated with respect to the insulating substrate;
and in that the upper electrode is not flat and is furthermore inserted between two adjacent zones until it reaches a level below that of the lower electrodes.

This being the case, it is possible to achieve optical isolation and therefore reduce the optical intermodulation without having to matrix the detection layer.

Specifically, by virtue of the particular structure claimed in this way, the electric field lines at the pixel edge are curved so as to obtain electric fields with opposite directions on either side of the centre of the inter-pixel region.

This consequently forces the carriers to be directed towards the closest electrode.

According to the invention, the insulating substrate consists of a layer of insulating material deposited on a signal processing circuit.

According to a first embodiment of the invention, the zones each consist of an individualized additional insulating layer deposited on the insulating substrate.

According to another embodiment of the invention, the zones form an integral part of the insulating substrate.

Advantageously, the surface zones have a raised shape, so that the photosensitive detection layers of two adjacent pixels face one another substantially vertically at the pixel edge, with strictly opposite polarities.

According to another advantageous characteristic of the invention, the photoelectric detectors are composed of PIN, NIP, PI, NI, IP or IN diodes.

Furthermore, according to the invention, the photosensitive material is based on silicon optionally alloyed with hydrogen, germanium or carbon.

Furthermore, according to another advantageous characteristic of the invention, the space between the photosensitive materials of two neighbouring detectors is reduced to twice the thickness of the transparent electrode, and typically of the order of 100 nm.

The invention also relates to a method for the production of a photoelectric detector of the type described above.

This method for the production of a detection circuit, consisting of a matrix of elementary detectors deposited on an insulating substrate and associated with a sense circuit, consists:
in producing a metallization layer for each of the elementary detectors, which is connected to the sense circuit by means of conductors passing through the insulating substrate;
in depositing a layer of an electrically insulating material on the insulating substrate, so as to enclose the said metallization layer;
in producing a hole in the said layer until it reaches the metallization layer, and in filling the hole produced in this way with an electrically conductive material which therefore comes into electrical contact with the said metallization layer;
in depositing an electrode intended to become a lower electrode on the upper surface of the insulating layer, the said electrode being in electrical contact with the electrical conductor;
in depositing a layer of photosensitive material on all of the matrix produced in this way, which substantially follows the shape of each of the elementary assemblies consisting of the insulating layer and the lower electrode;
in depositing a single phototransparent upper electrode on the stack produced in this way, which in turn also follows the shape of the insulating zones, so that it descends to a level below the level of the lower electrodes.

The invention also relates to another method for the production of such photoelectric detectors.

This method for the production of a detection circuit, consisting of a matrix of elementary detectors deposited on an insulating substrate and associated with a sense circuit, consists:
in depositing a conductive metal layer and in connecting it to the sense circuit by means of a conductor;
in carrying out lithography and etching of this metal layer, so as to produce individualized lower electrodes;
in carrying out deep etching within the insulating substrate;
then in depositing a photosensitive layer, including where the insulating substrate has been etched, so that the photosensitive layer follows the particular profile produced in this way;
and lastly in depositing a single phototransparent upper electrode, including where the insulating substrate has been etched, so that the said upper electrode is inserted into the inter-pixel space in order that it descend to a level below the level of the lower electrode.

BRIEF DESCRIPTION OF THE DRAWINGS

The way in which the invention is embodied, and the advantages which result therefrom, will become more readily apparent from the following exemplary embodiments which are given by way of indication, and without implying any limitation, with reference to the appended figures.

DETAILED DESCRIPTION OF THE INVENTION

Figure 1:
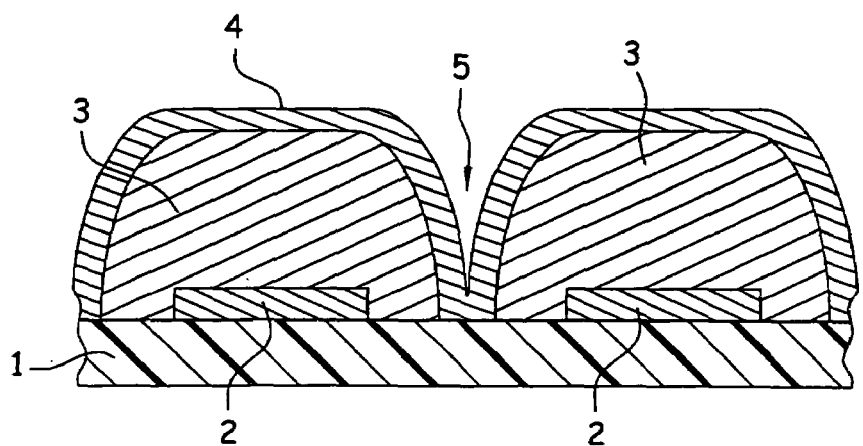
FIG. 1, as already indicated, is a schematic representation of a photoelectric detector according to the prior art.
Figure 2:
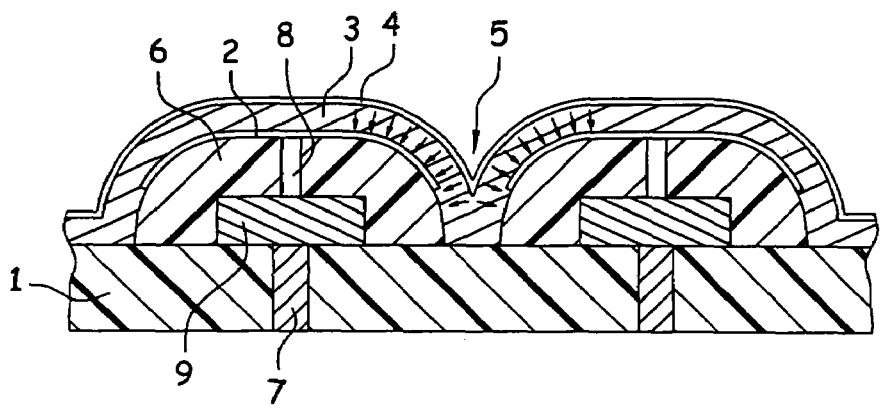
FIG. 2 is a schematic representation in section of a photoelectric detector according to a first embodiment of the invention.

The photoelectric detector according to the invention has therefore been represented in relation to FIG. 2. In order to simplify the schematic representation, the sense circuit has not been represented in this figure. Furthermore, the various numerical references corresponding to elements or components which are identical to those of the prior art have been retained.

According to the invention, for each pixel, the photoelectric detector firstly includes a metallization layer (9) with a relatively large thickness, typically 1 μm, which is connected to the sense circuit by means of a conductor or "plug" (7).

This metallization layer (9) is then enclosed in an insulator deposit (6), such as a silicon oxide, a silicon nitride, a silicon oxynitride or any combination thereof. This insulator deposit (6) therefore comes into contact with the silicon of the insulating support (1), and constitutes a convexly shaped zone as can be seen in FIG. 2. This deposit (6) may be produced by plasma-assisted CVD (chemical vapour deposition) at a low temperature (400° C.).

Once the zone (6) has been produced, a hole is formed from the upper surface of the said zone, until it reaches the metallization layer (9). This hole is filled with an electrically conductive material (8), which in turn comes into contact with the metallization layer (9).

The lower electrode (2) of the pixel is then deposited on the upper surface of the zone (6), for example by cathode sputtering. This lower electrode with a relatively small thickness, typically 50 nm, descends as far as possible on either side of the zone (6), but without reaching the base of the zone in contact with the substrate (1).

The deposition of the diode (3) of the PIN, NIP, NI, PI, IN or IP type is then carried out, in particular using amorphous silicon.

As can be seen clearly in FIG. 2, this amorphous silicon layer follows the contours of the various zones (6) and furthermore fills the inter-pixel gap (5) between two adjacent zones.

The deposition of a single upper electrode (4) for all the pixels of the detector is then carried out, this upper electrode being phototransparent, in particular made of indium tin oxide (ITO).

According to one characteristic of the invention, the upper electrode (4) is also inserted into the inter-pixel space (5) between two adjacent zones and, in particular, it reaches a level lower than the level reached by the lower electrode (2).

This being the case, it can be seen that the electric field lines in the inter-pixel region (5) are opposite, hence forcing the carriers to be directed towards the closest lower electrode. Some of these field lines have furthermore been marked in FIG. 2 to illustrate the result which is obtained.

According to one advantageous characteristic of the invention, the isolating distance between the two photosensitive materials of two adjacent pixels is close to twice the thickness of the phototransparent upper electrode (4) (100 nm for the detection of visible light at 400–800 nm), helping to limit the optical intermodulation phenomena. The detection region of a pixel is thus as close as possible to that of the neighbouring pixel: the electrons produced by the photons are combined in one or other of the pixels. The optical isolation of the pixels is therefore improved.

In parallel, the convex profile (that is to say without any acute angles) of the zones (6), and concomitantly of the lower electrode (2), makes it possible to limit the dark current and thereby to increase the dynamic response of the detection system produced in this way.

Figure 3:
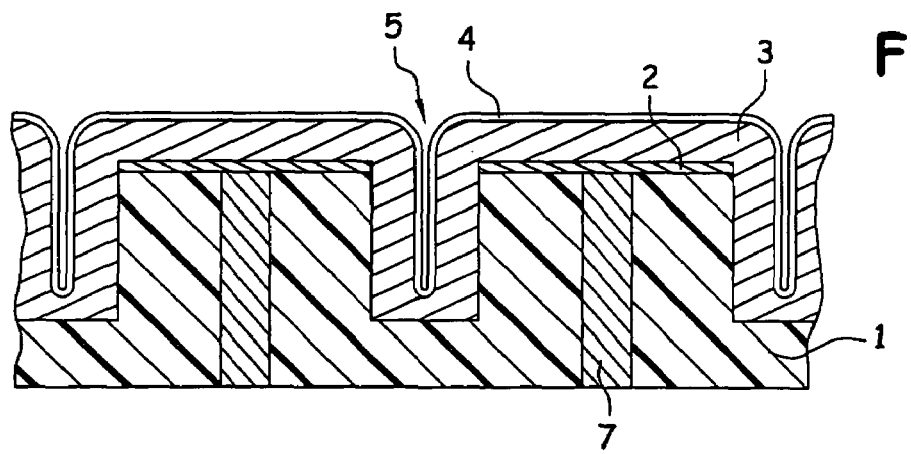
FIG. 3 is a similar view to FIG. 2 according to another embodiment of the invention.

According to a variant of the invention which is represented in FIG. 3, however, it is possible not to employ such a convex shape of the lower electrode.

In this embodiment, the deposition of a metal layer on the insulating substrate (1) is firstly carried out in the traditional way, the said layer being connected to the sense circuit by means of conductors or "plugs" (7).

Lithography and etching of this metal layer are then carried out, so as to form the lower electrodes (2). Deep etching is then carried out within the insulating substrate (1).

A photosensitive layer (3) intended to form the detection diode is then deposited on the assembly produced in this way, including where the insulating substrate has been etched, so that it follows the particular profile produced in this way.

The phototransparent upper electrode (4) is then deposited and is inserted into the inter-pixel space (5), where it can be seen to descend to a level significantly below that of the lower electrode (2) within the said space, hence making it possible to reduce the optical intermodulation phenomena as for the embodiment described in connection with FIG. 2.

The height of the inter-pixel walls is relatively large in the example which is described, of the order of one μm. A gentler slope may nevertheless be envisaged at this level, produced either by etching or by deposition. In this case as well, the electric field lines are directed radially around each pixel and in an opposite direction on either side of the upper electrode, still forcing the carriers to be directed towards the closest lower electrode.

Irrespective of the embodiment which is adopted, it should be emphasized that the use of such substrate structuring leads to a gain in terms of mechanical bonding of the various layers to one another, by virtue of local strain relaxation effects.

This is because the strains of the sensitive material do not propagate throughout the surface of the deposit, but are confined to the surface of each pixel. The bonding of the deposit is improved by the roughness of the substrate, this roughness being generated by the structuring of its surface.

There is therefore no longer any propagation of strains as in the case of a planarized structure, and the bonding is hence improved greatly by this.

The invention claimed is:

1. A photoelectric detection device comprising a matrix of elementary detectors on an insulating substrate, each of the elementary detectors comprising a stack consisting of a lower electrode, a layer of a photosensitive material and a phototransparent upper electrode, the upper electrode being common to all the elementary detectors, each of the lower electrodes being connected independently of one another to a sense circuit,
   wherein the lower electrodes are each positioned on an individualized insulating zone which is elevated with respect to the insulating substrate, and
   the upper electrode is not flat and is inserted between two adjacent zones until it reaches a level below that of the lower electrodes.

2. The photoelectric detection device according to claim 1, wherein the insulating substrate consists of a layer of insulating material deposited on a signal processing circuit.

3. The photoelectric detection device according to claim 1, wherein the zones each consist of an individualized additional insulating layer deposited on the insulating substrate.

4. The photoelectric detection device according to claim 1, wherein the zones form an integral part of the insulating substrate.

5. The photoelectric detection device according to claim 1, wherein the zones have a raised shape, so that the photosensitive detection layers of two adjacent pixels face one another substantially vertically at the pixel edge, with strictly opposite polarities.

6. The photoelectric detection device according to claim 1, wherein the photoelectric detectors comprise PIN, NIP, PI, NI, IP or IN diodes.

7. The photoelectric detection device according to claim 1, wherein the photosensitive material comprises silicon.

8. The photoelectric detection device according to claim 1, wherein the photosensitive material comprises silicon alloyed with hydrogen, germanium or carbon.

* * * * *